(12) United States Patent
Wang et al.

(10) Patent No.: US 11,301,614 B1
(45) Date of Patent: Apr. 12, 2022

(54) FEASIBILITY ANALYSIS OF ENGINEERING CHANGE ORDERS

(71) Applicant: Synopsys, Inc., Mountain View, CA (US)

(72) Inventors: Kai-Ping Wang, Fremont, CA (US); Haiying Ying Liu, Sunnyvale, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 17/132,257

(22) Filed: Dec. 23, 2020

Related U.S. Application Data (60) Provisional application No. 62/955,601, filed on Dec. 31, 2019.

(51) Int. Cl.
| | | |
|---|---|---|
| *G06F 30/398* | (2020.01) | |
| *G06F 30/373* | (2020.01) | |
| *G06F 30/367* | (2020.01) | |
| *G06F 30/33* | (2020.01) | |
| *G06F 30/337* | (2020.01) | |
| *G06F 30/392* | (2020.01) | |
| *G06F 30/3947* | (2020.01) | |
| *G06F 30/3953* | (2020.01) | |
| *G06K 9/62* | (2022.01) | |

(52) U.S. Cl.
CPC ............ *G06F 30/398* (2020.01); *G06F 30/33* (2020.01); *G06F 30/367* (2020.01); *G06F 30/373* (2020.01); *G06K 9/6218* (2013.01); *G06F 30/337* (2020.01); *G06F 30/392* (2020.01); *G06F 30/3947* (2020.01); *G06F 30/3953* (2020.01)

(58) Field of Classification Search
CPC .... G06F 30/398; G06F 30/373; G06F 30/367; G06F 30/33; G06F 30/337; G06F 30/392; G06F 30/3947; G06F 30/3953
USPC ............... 716/122, 124, 125, 129, 130, 131; 703/15
See application file for complete search history.

(56) References Cited

U.S. PATENT DOCUMENTS

| | | | | |
|---|---|---|---|---|
| 7,965,107 | B2 * | 6/2011 | Ciccarelli | ......... H01L 27/11807 326/101 |
| 8,060,853 | B2 * | 11/2011 | Orita | ..................... G06F 30/394 716/139 |
| 9,576,091 | B1 * | 2/2017 | Evans | ..................... G06F 30/30 |
| 9,672,306 | B2 * | 6/2017 | Evans | ..................... G06F 30/30 |
| 10,055,528 | B1 * | 8/2018 | Ginetti | ................... G06F 30/398 |

(Continued)

*Primary Examiner* — Phallaka Kik
(74) *Attorney, Agent, or Firm* — Fenwick & West LLP (57) ABSTRACT

An existing design of an integrated circuit includes existing cells that have already been placed and routed. An engineering change order (ECO) specifies additional new cells (ECO cells) to be inserted into the existing design. The ECO cells are also associated with target locations for their placement among the existing cells, but these target locations may violate design rules. The feasibility of "legalizing" the placement of the ECO cells within the existing design is assessed as follows. The ECO cells are clustered into clusters based on their target locations. Clusters are assessed by determining an ECO placement impact (EPI) index for individual clusters. The EPI index is a measure of the feasibility for legalizing the placement of the ECO cells in that cluster.

20 Claims, 9 Drawing Sheets
(3 of 9 Drawing Sheet(s) Filed in Color)

(56) References Cited

U.S. PATENT DOCUMENTS

| | | | |
|---|---|---|---|
| 10,055,529 B1* | 8/2018 | Ginetti | G06F 30/398 |
| 10,073,942 B1* | 9/2018 | Ginetti | G06F 30/398 |
| 10,192,020 B1* | 1/2019 | Ginetti | G06F 30/39 |
| 10,210,299 B1* | 2/2019 | Ginetti | G06F 30/398 |
| 10,282,505 B1* | 5/2019 | Ginetti | G06F 30/398 |
| 2004/0003366 A1* | 1/2004 | Suzuki | G06F 30/39 716/124 |
| 2007/0094629 A1* | 4/2007 | Alter | G06F 30/392 716/122 |
| 2010/0164547 A1* | 7/2010 | Ciccarelli | G06F 30/39 326/103 |
| 2010/0201400 A1* | 8/2010 | Nardone | G06F 30/39 326/101 |
| 2011/0055791 A1* | 3/2011 | Gao | G06F 30/392 716/131 |
| 2013/0205266 A1* | 8/2013 | Chen | G06F 30/394 716/55 |
| 2017/0116366 A1* | 4/2017 | Seo | G06F 30/39 |
| 2019/0138682 A1* | 5/2019 | Correale, Jr. | G06F 30/392 |

\* cited by examiner

FEASIBILITY ANALYSIS OF ENGINEERING CHANGE ORDERS

RELATED APPLICATION

This application claims the benefit of U.S. Provisional Application No. 62/955,601, "ECO Implementation Feasibility Analysis," filed Dec. 31, 2019, which is incorporated by reference in its entirety.

TECHNICAL FIELD

The present disclosure relates to the design and development of integrated circuits and, more specifically, to engineering change orders for integrated circuits.

BACKGROUND

With advances in technology, integrated circuit designers often may try automated solutions first in the hope that an automated solution will be sufficient for complete the design. However, this does not always work in the engineering change order (ECO) phase. ECOs are additions to an integrated circuit design that occur late in the design process. Most of the integrated circuit may already be laid out (placed and routed), when some additional ECO circuitry is added to the design. For example, the ECO may be a manual fix or performance enhancement or due to late changes in specifications or functions. Because most of the integrated circuit has already been laid out, automated solutions to place and route the additional ECO circuitry may not be successful or may take a long time to execute with just mediocre results.

SUMMARY

In certain embodiments, a method includes the following steps. An engineering change order (ECO) is received for an existing design of an integrated circuit. The existing design contains previously placed and routed existing cells. The engineering change order specifies ECO cells to be inserted into the existing design. The ECO cells are associated with target locations for placement of the ECO cells among the existing cells. The ECO cells are clustered into clusters based on the target locations of the ECO cells. For each cluster, a processor determines an ECO placement impact (EPI) index that is indicative of a feasibility for legalizing placement of the ECO cells in that cluster.

After the placement of ECO cells has been legalized, the ECO cells may be reclustered and a processor may additionally determine an ECO routing impact (ERI) index indicative of a feasibility for routing the ECO cells in that cluster.

Other aspects include components, devices, systems, improvements, methods, processes, applications, computer readable mediums, and other technologies related to any of the above.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Aspects of the present disclosure relate to feasibility analysis of engineering change orders (ECO). ECOs are additions to an integrated circuit design that occur late in the design process. Typically, most of the integrated circuit is already laid out (placed and routed), when some additional circuitry (ECO cells) is added to the design.

Certain ECO implementation flows include two phases: (1) legalization, which is the placement of the ECO cells at legal locations within the existing design, and (2) routing to the placed ECO cells. The ECO cells are associated with target locations, but placement at these locations may violate design rules. The desired outcome of ECO legalization is to place the newly added ECO cells at "legal" locations close to the target locations, for example based on the targeted timing QoR (Quality of Results). If the available legal location is too far away from the targeted location, the desired timing QoR may not be met. Sometimes, to reduce the potential displacement of ECO cells, existing non-ECO cells may be moved to make room for the ECO cells. In this case, if too many non-ECO cells are moved, then the existing design could be adversely impacted. In general, a designer may be able to manually manage the impact of a small number of ECO cells, but this becomes more difficult as the number of ECO cells increases and especially if the ECO cells are densely packed or located in an area that is already densely populated by existing cells.

For ECO routing, if the number of routing design rule check (DRC) errors introduced by ECO cells is large, the routing software will have to work hard to try to address these routing DRC errors. Also, some of the routing DRC errors may be difficult to address. The routing software may spend a lot of time but still leave many unresolved routing DRC errors. Similar to ECO legalization, a designer may be able to manually manage a small number of ECO cells, but this becomes more difficult as the number and density of ECO cells increases.

As a result, after spending a lot of time on the ECO legalization and routing tasks, a designer may find the resulting ECO implementation does not meet design requirements. For example, ECO cells may have been moved too far away from their target locations due to a lack of empty sites close to the target locations, or ECO routing may be too long or circuitous because the existing routing (nets) already occupied most of the routing lanes. In these cases, the designer has spent a lot of time and effort but may not be able to get the design to meet the design requirements.

Furthermore, if the time allocated to design is short, if the ECO implementation does not converge, the design could potentially miss the targeted schedule. This is not a desired outcome. If the designer had the capability to assess the feasibility of the ECO before actually performing the ECO legalization and/or routing, they could save time by avoiding or modifying ECOs that have low feasibility. The feasibility assessments may also be used to prioritize ECOs or to avoid the application of automated solutions to less feasible ECOs, thus reducing the amount of processor time, memory storage and other resources required to complete the design process for the integrated circuit.

In one approach, ECO feasibility may be assessed before ECO legalization or before ECO routing as follows. ECO cells are clustered based on their target locations or based on their actual legal locations (if the assessment is after legalization of the ECO cells). Measures of the feasibility for legalizing the placement of the ECO cells in a cluster or for routing the ECO cells in a cluster are then determined.

Before spending the time to fully implement an ECO, it is useful for the designer to determine the feasibility of implementing the ECO within the existing design. The existing design includes existing cells that have already been placed and routed. The ECO specifies additional new cells (ECO cells) to be inserted into the existing design. Target locations for placement of the ECO cells among the existing cells are also specified.

A first step in the ECO design flow is to "legalize" placement of the ECO cells, often referred to simply as "legalization." ECO cells are legally placed if their placement does not violate design rules applicable at that stage of design. These rules are referred to as cell legalization rules. The target locations are desirable locations, but they may not be legal locations. In one aspect, the feasibility of legalizing the placement the ECO cells is assessed as follows. The ECO cells are clustered into clusters based on their target locations. Clusters are assessed by determining an ECO placement impact (EPI) index for individual clusters. The EPI index is a measure of the feasibility for legalizing placement of the ECO cells in that cluster. Different types of EPI indices may be used and multiple indices may be considered or combined to assess the feasibility. For example, an EPI index may be based on the number of free (unoccupied) sites available in a bounding box for that cluster. Another EPI index may be based on displacements between the target locations for ECO cells and the predicted final legal locations. Yet another EPI index may be based on the number of existing cells predicted to be impacted by placement of the ECO cells. For example, some existing cells may be moved to make room for the ECO cells.

Once placement of the ECO cells is legalized, a next step is to route the legally placed ECO cells. Routing is the layout of interconnects (nets) to cells. A similar approach may be used to assess the feasibility of routing the ECO cells. The ECO cells are clustered into clusters based on their placement at legal locations. Clusters are then assessed by determining an ECO routing impact (ERI) index for individual clusters, which is a measure of the feasibility for routing the ECO cells in that cluster. For example, the ERI index may be based on the density of existing routing (nets) that traverses a bounding box that contains the ECO cells. Denser existing routing means that less routing resource is available to route the ECO cells.

The feasibility assessments for legalization and routing may be used in different ways. In one approach, if the EPI or ERI indices indicate unacceptable feasibility, a notification may be generated so that the end user has an opportunity to adjust the ECO before spending the time and resources to attempt legalization and/or routing. Alternatively, if the indices indicate acceptable feasibility, electronic design automation tools may automatically proceed with legalization and/or routing. In one approach, "acceptable" and "unacceptable" feasibility is defined by the value of the EPI or ERI index relative to some threshold, which may be adjustable by the end user.

Figure 1:
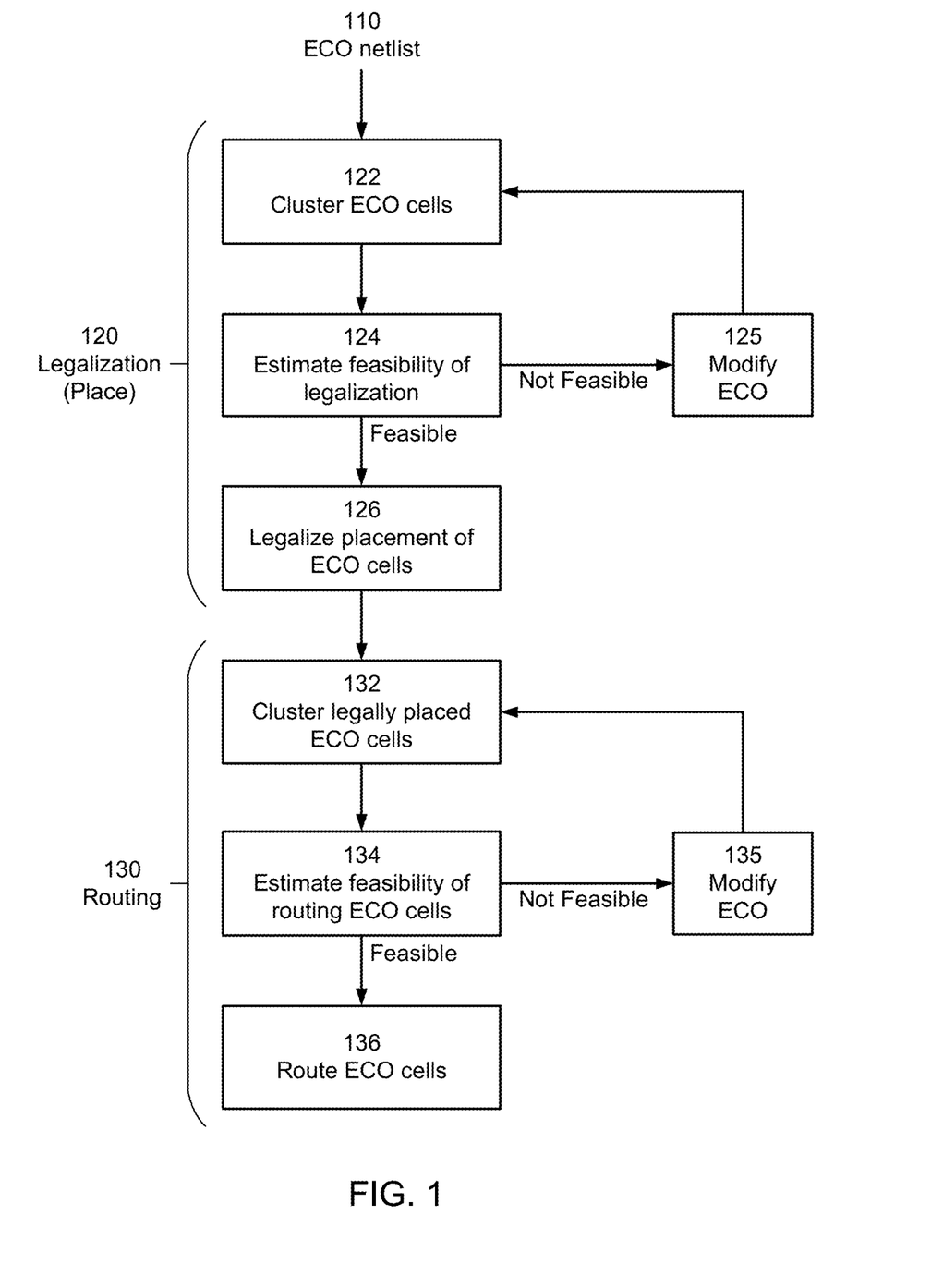
FIG. 1 depicts a flow diagram for assessing feasibility of ECO implementation.

FIG. 1 depicts a flow diagram for assessing feasibility of ECO implementation. The ECO is received in the form of an ECO netlist 110. A netlist generally contains a set of cells, which are pieces of digital circuitry, and interconnections between cells. The ECO netlist contains the unplaced and unrouted ECO cells and the already placed and routed existing cells. The interconnections between cells are sometimes referred to as nets. The ECO netlist may also include target locations for the ECO cells, or these may be otherwise provided for example by manual specification by the designer. As described above, the ECO design phase includes legalization (placement) 120 and routing 130. Each of these phases includes a clustering 122, 132 of the ECO cells, and then a feasibility assessment 124, 134 for legalization or routing of the ECO cells in the clusters. If the task is acceptably feasible, then legalization 126 or routing 136 proceeds. If the feasibility is unacceptable, then some other action may be taken. In this example, the ECO is modified 125, 135 to make it more feasible to implement.

The feasibility assessment provides early insight into the impact of ECO implementation. Assessing feasibility before carrying out the major steps of ECO legalization and routing can estimate the difficulty of these tasks in advance and may also point out problem areas. Once these issues are identified, designers can take corresponding actions.

The following disclosure provides additional descriptions of example embodiments of these different steps. The placement feasibility assessment 120 is described first. Most of this description also applies to the routing feasibility assessment 130 but will not be repeated for convenience.

Clustering ECO Cells

In step 122, a feasibility assessment tool creates ECO cell clusters from the ECO cells in the ECO netlist. The following example uses a two-pass approach for clustering 122 the ECO cells. The first pass creates coarse grain clusters and the second pass creates finer grain clusters.

Figure 2:
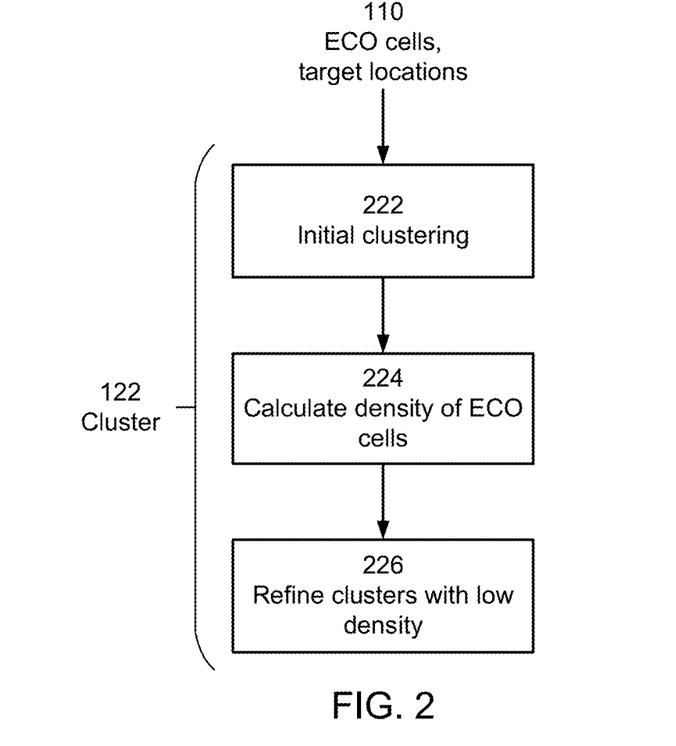
FIG. 2 depicts a flow diagram for two-phase clustering of ECO cells.

FIG. 2 depicts a flow diagram for one example of two-phase clustering of ECO cells. The clustering 122 includes initial clustering 222 and clustering refinement 226. In initial clustering 222, the ECO cells are grouped into initial clusters based on their target locations and the distances between the target locations. Conventional clustering techniques may be used to form initial clusters 222 in fast run time. However, initial clustering 222 may be improved. The objective of clustering in this application is to identify areas with high density of ECO cells. Therefore, the assessment tool calculates 224 the density of ECO cells in each of the clusters. For clusters where the density of ECO cells is below a threshold, those clusters are refined 226 into multiple smaller clusters with a higher density of ECO cells. In one approach, the threshold is derived from the average cell density in the design before applying the ECO.

Figure 3:
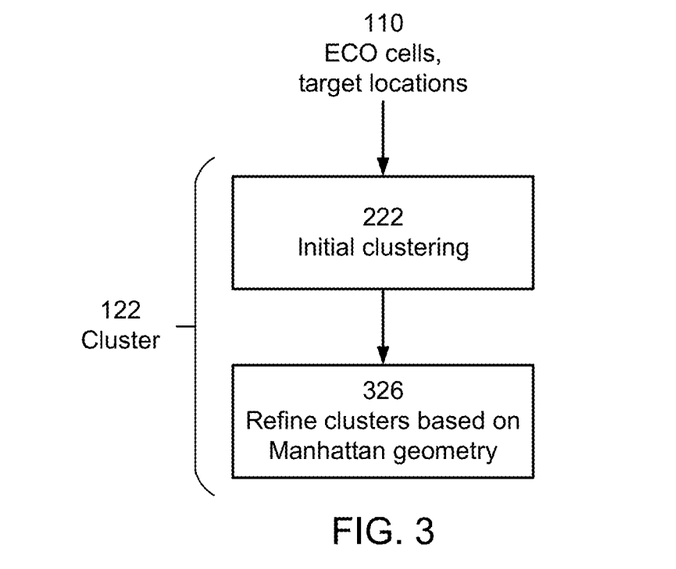
FIG. 3 depicts a flow diagram for another two-phase clustering of ECO cells.

FIG. 3 depicts a flow diagram for another example of two-phase clustering. In this example, the initial clustering 222 is the same as in FIG. 2. Certain clustering techniques may be based on the straight-line distance between ECO cells, so the resulting clusters may be more circular in shape. However, the design of integrated circuits is often based on Manhattan geometry. Cells in integrated circuits typically are rectangular in shape or represented by rectangular bounding boxes, and the routing between cells may be along vertical and horizontal routing lanes. Therefore, in some embodiments, the clustering may have a preference for horizontal or vertical distributions. In FIG. 3, the initial clustering which does not have horizontal or vertical preference is refined 326 to include these preferences. For example, the Manhattan distance may be used to measure the distance between cells.

ECO Placement Impact (EPI) Index

In step 124, the feasibility assessment tool estimates the feasibility of legalizing the placement of the ECO cells in a cluster. Any measure of this feasibility is referred to generically as an ECO Placement Impact (EPI) index. Different EPI indices will be described below. The overall feasibility may be determined by a set of one or more EPI indices.

Figure 4:
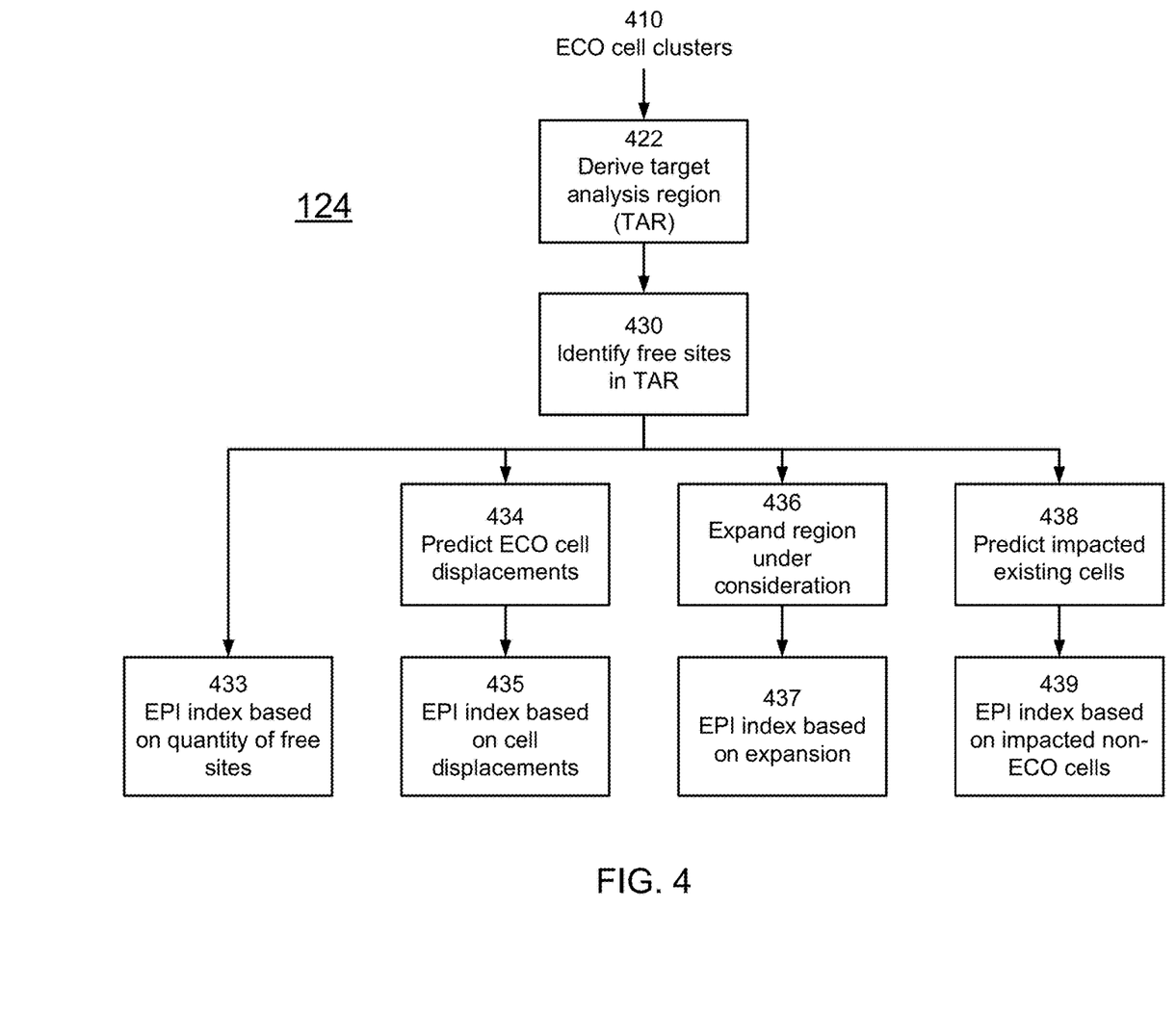
FIG. 4 depicts a flow diagram for determining various ECO Placement Impact indices.

FIG. 4 depicts a flow diagram for determining various EPI indices for each cluster. A target analysis region (TAR) for the cluster is derived 422. For example, the target analysis region may be a bounding box (or other bounding region) for the ECO cells in that cluster. The free sites in the TAR are identified 430. Free sites are areas which are not occupied, so the ECO cells may be legally placed at those locations. FIG. 4 shows four different examples of EPI indices 433, 435, 437, 439. EPI index 433 is based on the quantity of free sites in the TAR. For example, it may be based on the number of free sites, the area of free sites, the density of free sites, the ratio of the area of free sites to the area of the TAR, the ratio of free sites to existing cells in the TAR, and/or the ratio of free sites to ECO cells in the cluster.

The free sites may also be used to predict 434 the displacement of ECO cells resulting from legalization. ECO cells are assigned target locations based on the design requirements, for example the need to meet timing QoR. However, the target locations may not be legal, because they may violate cell legalization rules. As a result, ECO cells may not be placed at the target locations. They may have to be moved based on the availability of free sites. ECO cell legalization places each ECO cell on a legal location that satisfies the cell legalization rules. In general, designers prefer to place ECO cells on free sites to reduce the impact of newly added ECO cells on the existing design. However, if existing cells are crowded together and there are insufficient free sites for ECO cells, then some ECO cells may be moved farther away from their target locations. The cell displacement is the difference between the target location of an ECO cell and the predicted location of the ECO cell after legalization. If the displacement of an ECO cell is too large, it may not be able to satisfy design requirements (e.g., timing QoR). Thus, an EPI index 435 may be determined based on the predicted displacement of ECO cells, for example the average displacement or the maximum displacement.

In addition, since this is for feasibility assessment, the predicted legal locations may not be the actual final legal locations. Rather, the assessment tool may use a simpler or inexact approach to predict where ECO cells will be moved. For example, displacements may be calculated based on moving each ECO cell to the closest free site that is not already occupied by another ECO cell.

If there are not enough free sites within the TAR, the area under consideration may be expanded 436 beyond the current TAR until there are enough free sites to accommodate the ECO cells in the cluster. As another example, an EPI index 437 may be determined based on the amount of increase required.

Legalization may also involve moving existing, non-ECO cells to make room for ECO cells. However, if too many non-ECO cells are moved, it may impact the QoR for the existing design. In yet another approach, the number of existing cells that are impacted by legal placement of the ECO cells is predicted 438. An EPI index 439 may be determined based on the quantity of impacted existing cells, for example the number of impacted existing cells, the density of impacted existing cells or the ratio of impacted non-ECO cells to ECO cells.

The EPI indices described above are measures of the feasibility of successfully completing the ECO legalization process. If the EPI indices indicate poor feasibility, then the cell legalization process could take a long time. Accordingly, appropriate actions may be taken before time and resources are expended on cell legalization.

Figure 5A:
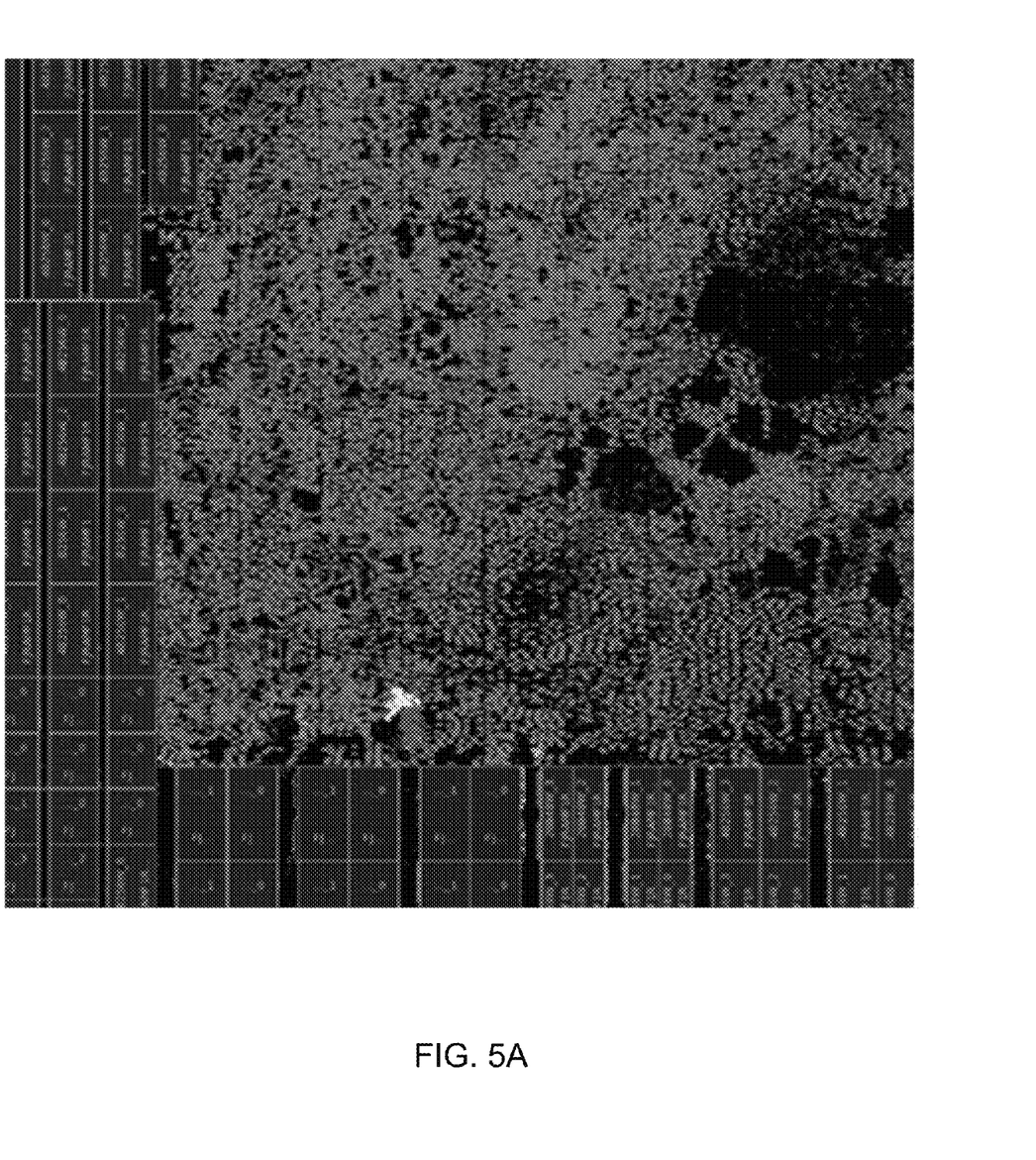
FIG. 5A depicts ECO cells and clusters from an integrated circuit.
Figure 5B:
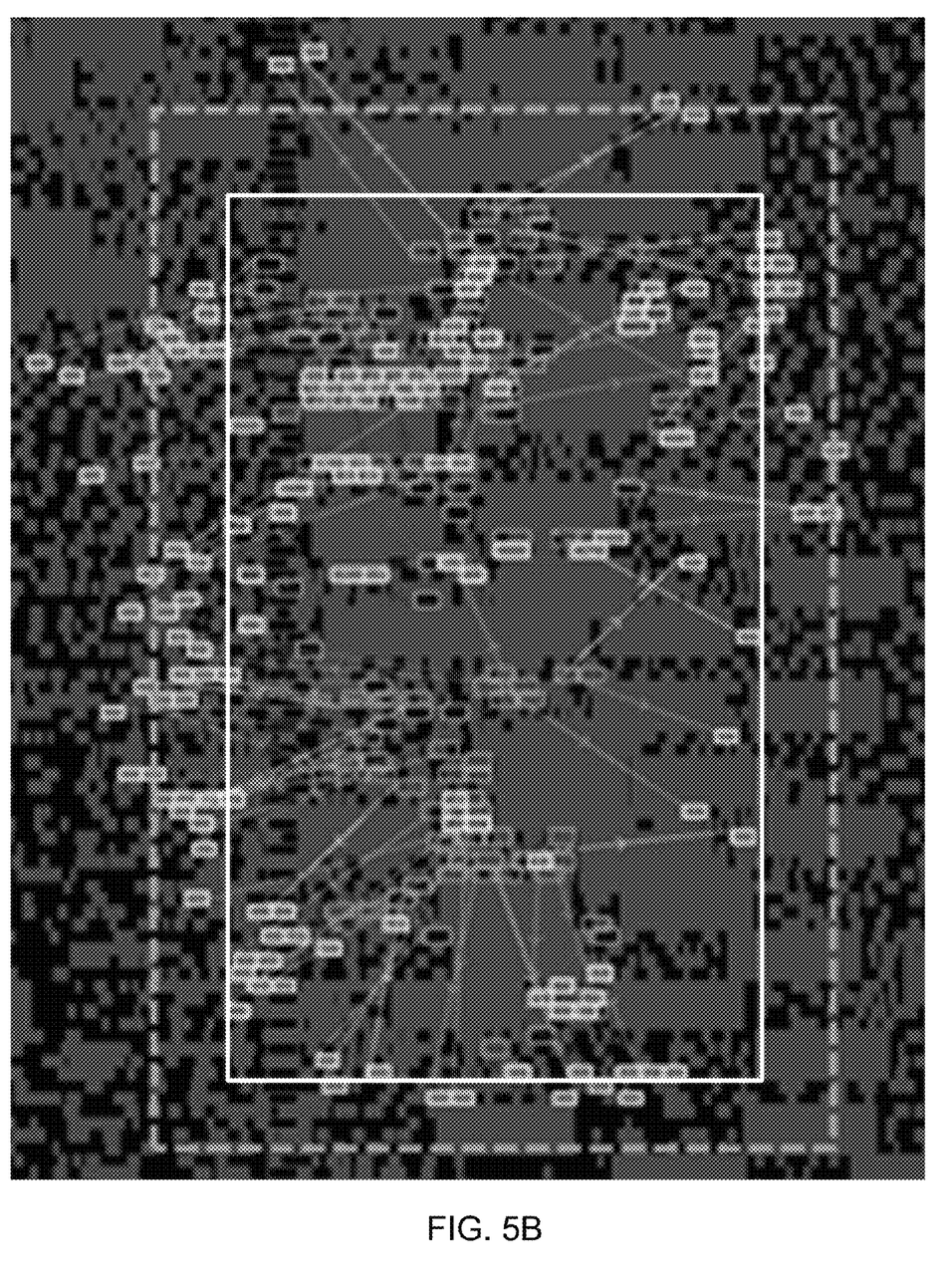
FIG. 5B depicts displacement of the ECO cells as a result of legalization.

FIGS. 5A-5B show an example of cell legalization. FIG. 5A is a screen shot of a design of an integrated circuit captured before cell legalization. In this figure, the ECO cells are represented as small bounding boxes. They are grouped into clusters, which are represented in red and yellow. The grey areas are locations that are occupied in the existing design. They may be occupied by existing cells, macros or blockages. The black areas are free sites where ECO cells may be placed.

FIG. 5B is zoomed into the cluster area of FIG. 5A. FIG. 5B shows clusters and ECO cell displacements after legalization. In FIG. 5B, the green bounding boxes are the ECO cells placed at their target locations. The TAR is the large white bounding box for these ECO cells in the red cluster of FIG. 5A. The white small boxes are the ECO cells after legalization. The blue dashed bounding box is the bounding box for the displaced ECO cells, because not all of the ECO cells could be legally placed within the TAR. Each white box is connected to the corresponding green box by a line that shows the displacement of the ECO cell resulting from legalization. These lines are color coded by displacement. Almost all the ECO cells are displaced outside the original large white bounding box after applying ECO legalization. The colors of the connecting lines correspond to different amounts of displacement. The analysis result shows that 10 ECO cells have displacement of 13.10 micron (magenta lines), 27 ECO cells have displacement of 10.92 micron (orange lines), 18 ECO cells have displacement of 8.73 micron (yellow lines). The green lines are lower displacements which are acceptable.

By analyzing potential ECO cell displacement and/or the number of impacted non-ECO cells, designers can predict the viability or difficulty of an ECO implementation. If the potential displacements of ECO cells are large, the resulting ECO implementation may not have the performance that the designer expects. Also, if the number of non-ECO cells impacted is large, the ECO implementation may have undesired side effects on the existing design. In any of these cases, the designer may want to reconsider implementing the ECO.

ECO Routing Impact (ERI) Index

Once ECO cells are legalized, the routing feasibility may be determined based on a similar approach as described above for placement. In step 134, the feasibility assessment tool estimates the feasibility of routing the legally placed ECO cells in a cluster. Any measure of this feasibility is referred to generically as an ECO Routing Impact (ERI) index. Different ERI indices will be described below. The overall feasibility may be determined by a set of one or more ERI indices.

The feasibility of routing may be evaluated based on clusters of legally placed ECO cells. If the number of ECO cells in a cluster is large, then non-ECO nets in the clusters are more likely to be rerouted. There could also be more routing DRC errors after ECO routing. This problem is more severe if the number of non-ECO nets in the TAR of the cluster is high. The run time of ECO routing will be high if routing software must spend a lot of effort rerouting the non-ECO nets within the ECO cell clustering area. With the information of ECO cell clustering, and the number of nets involved in the clustering areas, designers can set expectation on ECO routing run time.

Figure 6:
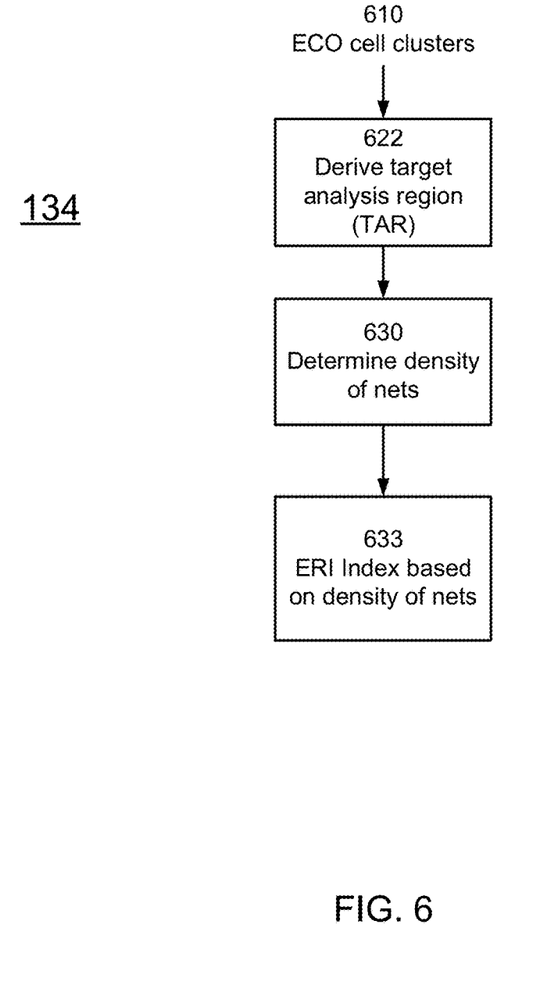
FIG. 6 depicts a flow diagram for determining various ECO Routing Impact indices.

FIG. 6 depicts a flow diagram for determining various ECO Routing Impact indices. After ECO legalization, the ECO cells will have been moved, so the ECO cells are reclustered 610. The clustering approaches described above may be used. Finer grain clusters are desirable for routing analysis, so shorter cell distances may be used as a clustering criteria. With finer grain clusters, the routing impact is more apparent in areas with high cell density. The prediction of routing impact can be more correlated to the final routing results. A target analysis region (TAR) for the cluster 610 is derived 622. For each TAR and each routing layer, the assessment tool analyzes 630 the density of existing nets. An ERI index may be determined 633 based on the density of nets. If the net density is larger than a threshold, ECO routing may be problematic.

Figure 7:
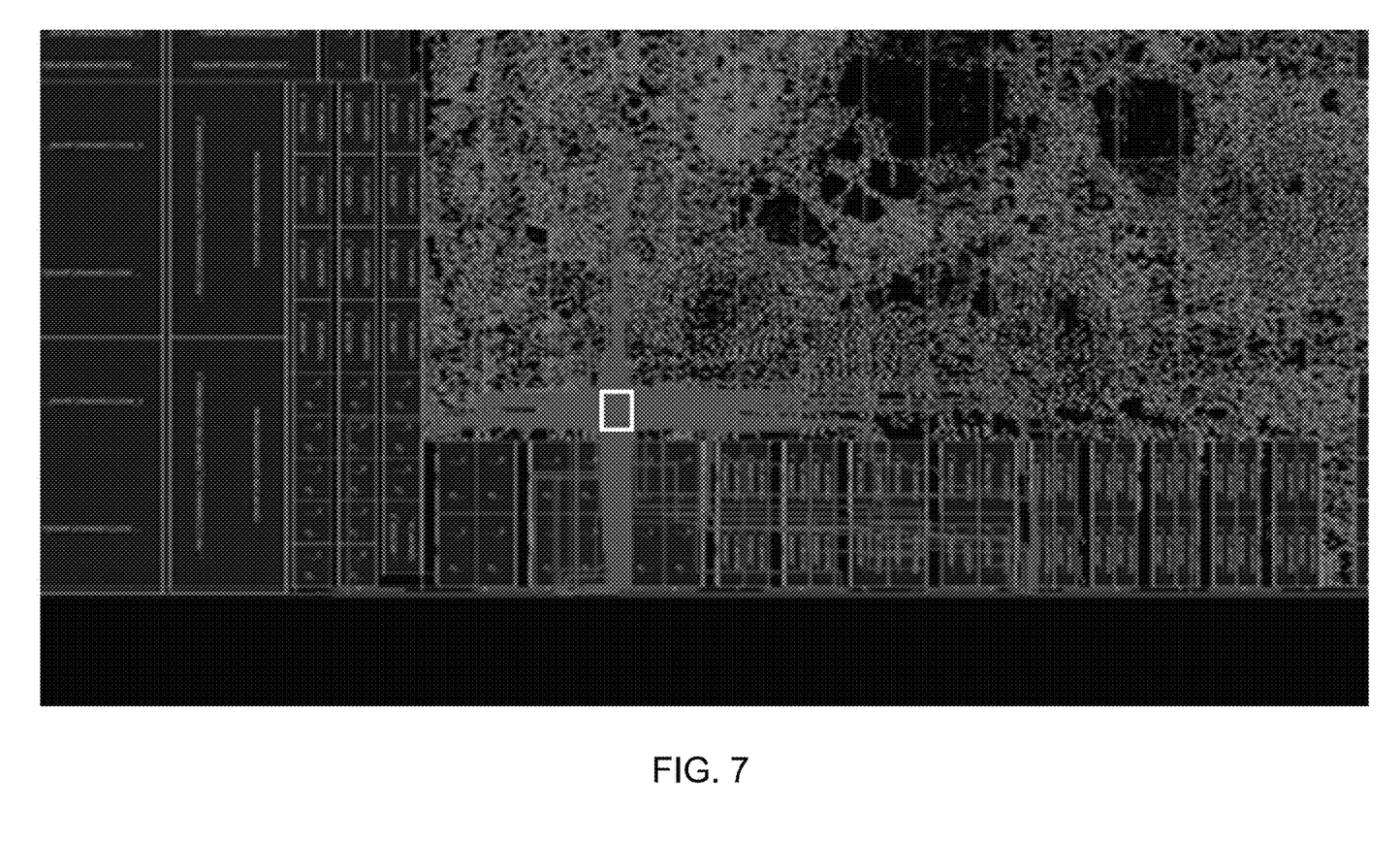
FIG. 7 depicts nets that traverse through an ECO cluster.

FIG. 7 is a screen shot of a design after ECO legalization. The white box is the TAR of an ECO cluster. All the red lines are nets that are connected to cells inside the TAR. These nets may be impacted by the ECO routing. The ERI index gives designers some insight to the feasibility or difficulty of ECO routing.

EDA Processes

Figure 8:
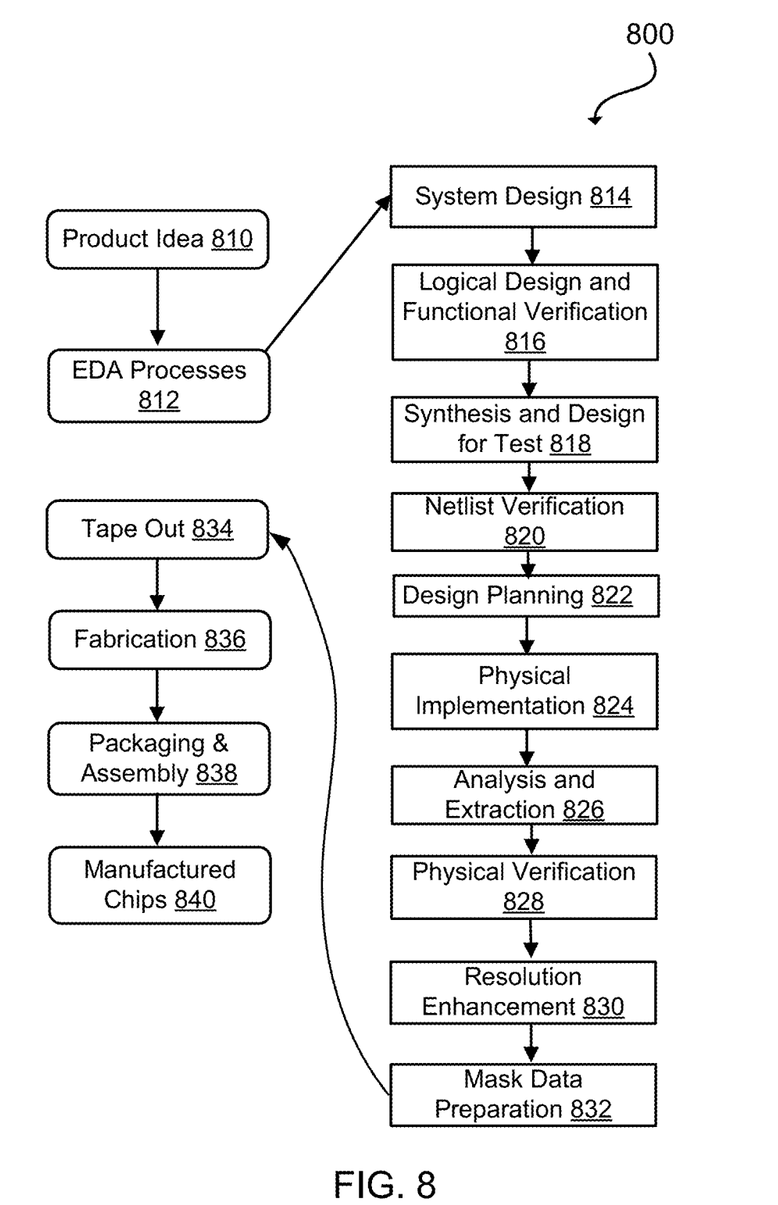
FIG. 8 depicts a flowchart of various processes used during the design and manufacture of an integrated circuit in accordance with some embodiments of the present disclosure.

The ECO process described above may be implemented after physical implementation 824 in FIG. 8. FIG. 8 illustrates an example set of processes 800 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 810 with information supplied by a designer, information which is transformed to create an article of manufacture that uses a set of EDA processes 812. When the design is finalized, the design is taped-out 834, which is when artwork (e.g., geometric patterns) for the integrated circuit is sent to a fabrication facility to manufacture the mask set, which is then used to manufacture the integrated circuit. After tape-out, a semiconductor die is fabricated 836 and packaging and assembly processes 838 are performed to produce the finished integrated circuit 840.

Specifications for a circuit or electronic structure may range from low-level transistor material layouts to high-level description languages. A high-level of abstraction may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower abstraction level that is a less abstract description adds more useful detail into the design description, for example, more details for the modules that include the description. The lower levels of abstraction that are less abstract descriptions can be generated by a computer, derived from a design library, or created by another design automation process. An example of a specification language at a lower level of abstraction language for specifying more detailed descriptions is SPICE, which is used for detailed descriptions of circuits with many analog components. Descriptions at each level of abstraction are enabled for use by the corresponding tools of that layer (e.g., a formal verification tool). A design process may use a sequence depicted in FIG. 8. The processes described by be enabled by EDA products (or tools).

During system design 814, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 816, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 818, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 820, the netlist is checked for compliance with timing constraints and for correspondence with the HDL code. During design planning 822, an overall floor plan for the integrated circuit is constructed and analyzed for timing and top-level routing.

During layout or physical implementation 824, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 826, the circuit function is verified at the layout level, which permits refinement of the layout design. During physical verification 828, the layout design is checked to ensure that manufacturing constraints are correct, such as DRC constraints, electrical constraints, lithographic constraints, and that circuitry function matches the HDL design specification. During resolution enhancement 830, the geometry of the layout is transformed to improve how the circuit design is manufactured.

During tape-out, data is created to be used (after lithographic enhancements are applied if appropriate) for production of lithography masks. During mask data preparation 832, the 'tape-out' data is used to produce lithography masks that are used to produce finished integrated circuits.

A storage subsystem of a computer system (such as computer system 900 of FIG. 9) may be used to store the programs and data structures that are used by some or all of the EDA products described herein, including for the feasibility assessment tool, and products used for development of cells for the library and for physical and logical design that use the library.

Figure 9:
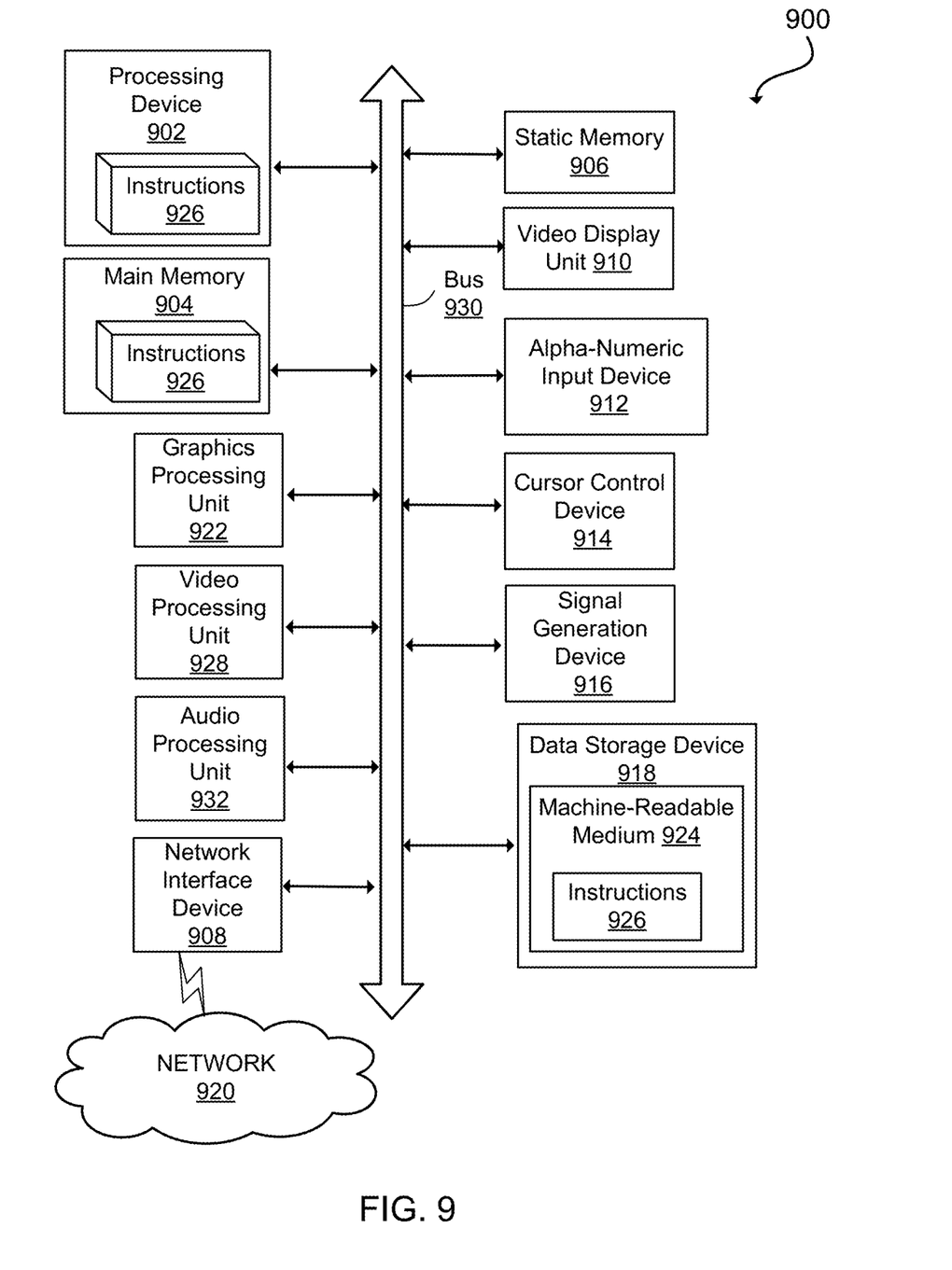
FIG. 9 depicts an abstract diagram of an example computer system in which embodiments of the present disclosure may operate.

FIG. 9 illustrates an example machine of a computer system 900 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM), a static memory 906 (e.g., flash memory, static random access memory (SRAM), etc.), and a data storage device 918, which communicate with each other via a bus 930.

Processing device 902 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 902 may also be one or more special-purpose processing devices such as an application specific integrated circuit (ASIC), a field programmable gate array (FPGA), a digital signal processor (DSP), network processor, or the like. The processing device 902 may be configured to execute instructions 926 for performing the operations and steps described herein.

The computer system 900 may further include a network interface device 908 to communicate over the network 920.

The computer system 900 also may include a video display unit 910 (e.g., a liquid crystal display (LCD) or a cathode ray tube (CRT)), an alphanumeric input device 912 (e.g., a keyboard), a cursor control device 914 (e.g., a mouse), a graphics processing unit 922, a signal generation device 916 (e.g., a speaker), graphics processing unit 922, video processing unit 928, and audio processing unit 932.

The data storage device 918 may include a machine-readable storage medium 924 (also known as a non-transitory computer-readable medium) on which is stored one or more sets of instructions 926 or software embodying any one or more of the methodologies or functions described herein. The instructions 926 may also reside, completely or at least partially, within the main memory 904 and/or within the processing device 902 during execution thereof by the computer system 900, the main memory 904 and the processing device 902 also constituting machine-readable storage media.

In some implementations, the instructions 926 include instructions to implement functionality corresponding to the present disclosure. While the machine-readable storage medium 924 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 902 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method comprising:
   accessing an engineering change order (ECO) for an existing design of an integrated circuit comprising previously placed and routed existing cells, the engineering change order specifying ECO cells to be inserted into the existing design, and wherein the ECO cells are associated with target locations for placement of the ECO cells among the existing cells;
   clustering the ECO cells into clusters based on the target locations of the ECO cells; and
   for each of the clusters: determining, by a processor, an ECO placement impact (EPI) index indicative of a feasibility for legalizing placement of the ECO cells in that cluster.

2. The method of claim 1, wherein clustering the ECO cells comprises:
   clustering the ECO cells into initial clusters based on the target locations of the ECO cells and distances between the target locations of the ECO cells;
   calculating ECO cell densities for the initial clusters; and
   for initial clusters with ECO cell density below a threshold, refining that initial cluster into smaller clusters with higher ECO cell densities than that initial cluster.

3. The method of claim 1, wherein determining the EPI index for each of the clusters comprises:
   determining a target analysis region for that cluster based on the target locations of the ECO cells in that cluster, wherein the target analysis region is a bounding region for the ECO cells in that cluster; and
   determining the EPI index based on the target analysis region.

4. The method of claim 1, wherein determining the EPI index for each of the clusters comprises:
   predicting displacements of ECO cells resulting from legalizing placement of the ECO cells in that cluster; and
   determining the EPI index based on the predicted displacements.

5. The method of claim 1, wherein determining the EPI index for each of the clusters comprises:
   determining a bounding region that contains the ECO cells in that cluster;
   increasing the area of the bounding region until the bounding region contains a sufficient quantity of free sites for legalizing placement of the ECO cells; and
   determining the EPI index based on the increase in area of the bounding region.

6. The method of claim 1, wherein determining the EPI index for each of the clusters comprises:
   predicting a number of existing cells impacted by legalizing placement of the ECO cells in that cluster; and
   determining the EPI index based on the predicted number of impacted existing cells.

7. The method of claim 1, wherein determining the EPI index for each of the clusters comprises:
   determining a bounding region that contains the ECO cells in that cluster; and
   determining the EPI index based on a quantity of free sites in the bounding region.

8. The method of claim 1, further comprising:
   placing the ECO cells at legal locations among the previously placed and routed existing cells of the integrated circuit;
   after placement of the ECO cells at legal locations, clustering the ECO cells into post-placement clusters based on the legal locations of the ECO cells; and
   for each of the post-placement clusters: determining an ECO routing impact (ERI) index indicative of a feasibility for routing the ECO cells in that post-placement cluster.

9. The method of claim 8, wherein determining the ERI index for each of the post-placement clusters comprises:
   determining a target analysis region for that post-placement cluster; and
   determining the ERI index based on the target analysis region.

10. The method of claim 8, wherein determining the ERI index for each of the post-placement clusters comprises:
    predicting a number of existing nets impacted by routing of the ECO cells in that post-placement cluster; and
    determining the ERI index based on the predicted number of impacted existing nets.

11. The method of claim 8, wherein determining the ERI index for each of the post-placement clusters comprises:
    determining a bounding region that contains the ECO cells in that post-placement cluster; and
    determining the ERI index based on a quantity of existing nets that traverse the bounding region for that cluster.

12. A system comprising:
    a memory storing instructions; and a processor, coupled with the memory and to execute the instructions, the instructions when executed cause the processor to:
   access an engineering change order (ECO) for an existing design of an integrated circuit comprising previously placed and routed existing cells, the engineering change order specifying ECO cells to be inserted into the existing design, and wherein the ECO cells are associated with target locations for placement of the ECO cells among the existing cells;
   cluster the ECO cells into clusters, comprising:
      clustering the ECO cells into initial clusters based on the target locations of the ECO cells and distances between the target locations of the ECO cells;
      calculating ECO cell densities for the initial clusters; and
      for initial clusters with ECO cell density below a threshold, refining that initial cluster into smaller clusters with higher ECO cell densities than that initial cluster; and
   for each of the clusters: determine an ECO placement impact (EPI) index indicative of a feasibility for legalizing placement of the ECO cells in that cluster, comprising:
      determining a target analysis region for that cluster based on the target locations of the ECO cells in that cluster, wherein the target analysis region is a bounding region for the ECO cells in that cluster; and
      determining the EPI index based on the target analysis region.

13. The system of claim 12, wherein the instructions when executed further cause the processor to:
   generate a notification for an end user, responsive to the EPI index indicating unacceptable feasibility for legalizing placement of the ECO cells.

14. The system of claim 12, wherein the instructions when executed further cause the processor to:
   place the ECO cells, responsive to the EPI index indicating acceptable feasibility for legalizing placement of the ECO cells.

15. The system of claim 12, wherein the instructions when executed further cause the processor to:
   execute a prespecified action responsive to the EPI index exceeding a threshold, wherein the threshold is adjustable by an end user.

16. The system of claim 12, wherein determining the EPI index for each of the clusters comprises:
   predicting displacements of ECO cells resulting from legalizing placement of the ECO cells in that cluster; and
   determining the EPI index based on the predicted displacements.

17. The system of claim 12, wherein determining the EPI index for each of the clusters comprises:
   predicting a number of existing cells impacted by legalizing placement of the ECO cells in that cluster; and
   determining the EPI index based on the predicted number of impacted existing cells.

18. A non-transitory computer readable medium comprising stored instructions, which when executed by a processor, cause the processor to:
   access a post-placement design of an integrated circuit, comprising previously placed and routed existing cells, existing nets connecting the existing cells, and unrouted ECO cells placed at legal locations among the existing cells;
   cluster the ECO cells into post-placement clusters based on the legal locations of the ECO cells; and
   for each of the post-placement clusters: determining, by a processor, an ECO routing impact (ERI) index indicative of a feasibility for routing the ECO cells in that post-placement cluster.

19. The non-transitory computer readable medium of claim 18, wherein determining the ERI index for each of the post-placement clusters comprises:
   predicting a number of existing nets impacted by routing of the ECO cells in that post-placement cluster; and
   determining the ERI index based on the predicted number of impacted existing nets.

20. The non-transitory computer readable medium of claim 18, wherein determining the ERI index for each of the post-placement clusters comprises:
   determining a bounding region that contains the ECO cells in that post-placement cluster; and
   determining the ERI index based on a quantity of existing nets that traverse the bounding region for that post-placement cluster.

* * * * *

UNITED STATES PATENT AND TRADEMARK OFFICE
CERTIFICATE OF CORRECTION

| | |
|---|---|
| PATENT NO. | : 11,301,614 B1 |
| APPLICATION NO. | : 17/132257 |
| DATED | : April 12, 2022 |
| INVENTOR(S) | : Kai-Ping Wang and Haiying Liu |

It is certified that error appears in the above-identified patent and that said Letters Patent is hereby corrected as shown below:

On the Title Page

Item (72), in Column 1, in "Inventors," Line 2, delete "Haiying Ying Liu" and insert -- Haiying Liu --.

Signed and Sealed this
Eleventh Day of October, 2022

Katherine Kelly Vidal
*Director of the United States Patent and Trademark Office*